United States Patent [19]

Harita et al.

[11] 4,169,068

[45] Sep. 25, 1979

[54] STRIPPING LIQUOR COMPOSITION FOR REMOVING PHOTORESISTS COMPRISING HYDROGEN PEROXIDE

[75] Inventors: Yoshiyuki Harita, Kawasaki; Hideyuki Hanaoka, Yokohama; Kunihiro Harada, Machida, all of Japan

[73] Assignee: Japan Synthetic Rubber Company Limited, Tokyo, Japan

[21] Appl. No.: 824,652

[22] Filed: Aug. 15, 1977

[51] Int. Cl.$^2$ .......................... C23G 5/02; B08B 3/08; C11D 7/38
[52] U.S. Cl. .................... 252/143; 252/100; 134/3; 134/38; 134/41; 134/42
[58] Field of Search ............... 252/142, 143, 146, 100, 252/549, 558, 79.2, 79.4; 134/3, 38, 41, 42

[56] References Cited

U.S. PATENT DOCUMENTS

| | | | |
|---|---|---|---|
| 3,075,923 | 1/1963 | Berst et al. | 252/144 |
| 3,582,401 | 6/1971 | Berilla et al. | 134/3 |
| 3,629,004 | 12/1971 | Cooper et al. | 252/143 X |
| 3,801,512 | 4/1974 | Solenberger | 156/664 X |
| 3,871,929 | 3/1975 | Schevey et al. | 134/3 X |
| 3,900,337 | 8/1975 | Beck et al. | 134/3 |
| 3,905,907 | 9/1975 | Shiga | 134/41 X |
| 3,988,256 | 10/1976 | Vandermey et al. | 252/171 |
| 4,051,057 | 9/1977 | Ericson et al. | 252/142 X |
| 4,070,203 | 1/1978 | Neisius et al. | 134/38 X |

*Primary Examiner*—Harris A. Pitlick
*Attorney, Agent, or Firm*—Toren, McGeady and Stanger

[57] ABSTRACT

A stripping liquor composition consisting essentially of (A) at least one compound selected from among sulfonic acids, acid esters of sulfuric acid, and acid esters of phosphoric acid, (B) hydrogen peroxide, and (C) at least one of organic solvents, with or without the addition of (D) at least one of polyhydric alcohols.

5 Claims, No Drawings

STRIPPING LIQUOR COMPOSITION FOR REMOVING PHOTORESISTS COMPRISING HYDROGEN PEROXIDE

This invention relates to a novel stripping liquor composition, that is, an agent for removing a photopolymer film hardened on exposure to light from its substrate surface.

Because of their chemical resistances, photopolymers are in use as photoresists in processing metals and in fabricating integrated circuits. Such resinous materials are divided roughly into two groups, vinyl cinnamate polymers and so-called rubber photoresists, or cyclized natural rubbers and polyisoprene rubbers in the cyclized form.

These materials when employed as photoresists must be removed after the steps of exposure, development, baking, and etching. Naturally, agents for stripping them have been studied extensively, resulting in a number of applications for patents. For example, investigations about stripping agents for the resists of vinyl cinnamate polymers have led to inventions of Japanese Patent Publication Nos. 2369,66, 2370/66, 20252/66, 2524/70, 12925/70, 5961/71, etc. As regards the agents for the rubber photoresists, inventions include Japanese Patent Publication No. 18922/71, Japanese Patent Application Disclosure No. 72503/76, and U.S. Pat. No. 3,582,401. The agents so far proposed may be classified by type into three groups; those based mainly on a solvent such as Trichlene (trichloroethylene) (Japanese Patent Publication Nos. 2369/66, 2370/66, 12925/70, and 5961/71), on alkyl glycol or alkyl ether (Japanese Patent Publication Nos. 7695/68, 2524/70, and 18922/71), and on dodecylbenzenesulfonic acid (Japanese Patent Application Disclosure No. 72503/76, and U.S. Pat. No. 3,582,401). Also, in the manufacture of integrated circuits, some attempts have been made to employ concentrated sulfuric acid (Japanese Patent Application Disclosure Nos. 101107/75 and 138902/75) because the strong acid does not impair the substrate which usually consists of silicon. However, the IC fabrication necessarily involves photoetching of the aluminum deposited by evaporation, for which a stripping agent of concentrated sulfuric acid cannot be used. A customary practice in IC fabrication, therefore, is to use separate stripping agents, one for aluminum and the other, of the sulfuric acid type. This adds to the complexity of the fabrication work and, because of the danger of accident with sulfuric acid, a stripping agent safer and useful in common to all of known processes is being called for. The prior art stripping agents are rather limited in application. For example, the above-mentioned stripping agents for the resists of vinyl cinnamate polymers cannot be used in removing rubber photoresists, and the agents for the latter cannot remove the former.

In the course of our studies on photosensitive compositions (photoresists) composed essentially of polybutadienes and their cyclization products, we have already made some inventions (Japanese Patent Publication Nos. 19162/74, 10725/75, 11284/75, 11285/75 and U.S. Pat. No. 3,948,667).

Removal of these polybutadiene resists has been tried with the compositions as taught by the above-mentioned patented inventions. Microscopic examination of the resist surfaces has indicated that in no case the polybutadiene resists will undergo any change.

Polybutadiene resists can only be removed with concentrated sulfuric acid. Moreover, they are carbonized and stripped off while maintaining the fine pattern after development, in contrast to the rubber photoresists which are dissolved away in hot, concentrated sulfuric acid. Thus, it is apparent that the two are utterly different in the mode of coming off from the substrates.

Ordinarily, it is known that isoprene polymers undergo a decrease in molecular weight upon heating, due to degradation accompanied by scission of the principal chains, or due to so-called softening degradation, whereas butadiene polymers become insoluble with an increase in molecular weight due to so-called hardening degradation that involves crosslinking of the principal chains. In case of the isoprene polymer, presence of a solvent causes further molecular cleavage [P. S. Sarfare et al., J. Appl. Polymer Sci., 7, 2199 (1963)]. It has therefore been expected that removal of polyisoprene rubber resists will be easy and removal of polybutadiene resists will be very difficult.

We then added a hydrogen peroxide solution to a solution of dodecylbenzenesulfonic acid in o-dichlorobenzene. Surprisingly, contrary to our expectation that the stripping effect would be even more negligible because of the presence of water in the system, it was found that the polybutadiene resists actually dissolve rather than remaining totally insoluble. Further intense investigations made on this basis have led to the present invention.

Thus, according to this invention, a stripping liquor composition is provided which consists essentially of (A) at least one compound selected from among sulfonic acids, acid esters of sulfuric acid, and acid esters of phosphoric acid, (B) hydrogen peroxide, and (C) at least one of organic solvents.

The stripping liquor composition using a sulfonic acid in accordance with the invention will turn from opaque brown to clear yellow on heating. This is presumably attributed to some reaction that occurs between the sulfonic acid and hydrogen peroxide, and apparently it is with this reaction that the liquid acts effectively as a stripper.

When applied to a polybutadiene resist, the stripping liquor of the above composition will dissolve the resist away, for example, within 5 minutes at 60° C., without impairing the substrate of aluminum.

In the manufacture of integrated circuits the stripping liquor is used at a temperature of about 100° C. in order to shorten the fabrication time. At about 100° C. the composition applied to a polybutadiene resist will remove it in less than one minute but will have the danger of corroding the substrate of aluminum.

Presumably responsible for the corrosive attack is the fact that any of sulfonic acids, acid esters of sulfuric acid, or acid esters of phosphoric acid used is acidified by the water in the hydrogen peroxide solution. It was thought the addition of a neutralizing agent would restrict the aluminum corrosion, but investigations have revealed that the addition totally eliminates the resist removability of the composition as well as the possibility of corrosion.

In further studies, the above-mentioned stripping liquor composition was mixed with oleyl alcohol or a polyhydric alcohol of the structural formula

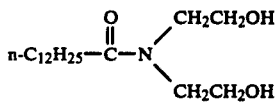

when the use of the polyhydric alcohol has been found effective in suppressing only the corrosiveness whereas oleyl alcohol is of no effect whatever.

According to this invention, therefore, a stripping liquor composition is provided which consists essentially of (A) at least one compound selected from among sulfonic acids, acid esters of sulfuric acid, and acid esters of phosphoric acid, (B) hydrogen peroxide, (C) at least one of organic solvents, and (D) at least one of polyhydric alcohols.

In practicing the invention, useful sulfonic acids are alkylarylsulfonic acid, alkylsulfonic acid, amide-bonded sulfonic acid, and ester-bonded sulfonic acid. Above all, alkylbenzenesulfonic acids, such as dodecylbenzenesulfonic acid and stearylbenzenesulfonic acid are preferred. The term "acid esters of sulfuric acid" is used herein to mean esters having the —OSO$_3$H group, for example, sulfuric esters of higher alcohols and ester-bonded sulfuric esters.

By "acid esters of phosphoric acid" are meant a variety of esters having the general formula PO(OR)$_2$OH or PO(OR)(OH)$_2$. Especially preferred is the phosphate of polyoxyethylene alkyl (aryl) ether expressed by the general formula

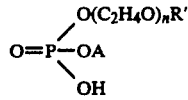

(wherein R' is an alkyl or alkylaryl group, A is hydrogen or R', and n is the number of moles of ethylene oxide added).

Among organic solvents, the good solvents for uncured resins are most suitable. They include halogenated hydrocarbons, such as o-dichlorobenzene, α-chloronaphthalene, and tetrachloroethylene, and aromatic hydrocarbons, such as xylene and isopropylbenzene.

Of polyhydric alcohols, dihydrics include such glycols as ethylene, glycol, propylene glycol, trimethylene glycol, and neopentyl glycol; dihydric alcohols containing ether bonds, such as diethylene glycol and dipropylene glycol; dihydric alcohols derived through nitrogen, such as diethanolamine, n—C$_{12}$H$_{25}$CON(C$_2$H$_4$OH)$_2$; and dihydric alcohols containing ester bonds, such as oleic acid monoglyceride.

Examples of trihydric and other polyhydric alcohols are glycerin, pentaerythritol, sorbitan monolaurate, and sorbitan trioleate.

When the stripping liquor composition of the invention is to be applied on a hardened photopolymer film, it is desirable that hydrogen peroxide and polyhydric alcohol be used in amounts within a range from 1 to 10 weight percent each of the combined weight of the acid material and organic solvent. The suitable ratio of the acid material to the organic solvent is between 50:50 and 10:90, preferably between 40:60 and 25:75 (by weight).

When using the stripping liquor of the components (A), (B), and (C), the liquor is heated in advance to about 40° to about 90° C., or when using the liquor of the components (A) to (D), the liquor is heated to about 40° to about 100° C., and then the wafer with the coated resin film to be removed has only to be immersed into the bath.

The stripping liquor composition according to the invention is superior to the prior art compositions in that it is capable of removing not only the resists of polybutadienes but also of polyisoprene resists. Moreover, it in some cases can remove the resists of vinyl cinnamate polymers, too.

The invention is illustrated by the following examples.

EXAMPLE 1

A photosensitive composition was prepared from cyclized cis-1,4-polybutadiene (degree of cyclization=65%, [η]=0.45), three weight percent of 2,6-bis(4'-azidobenzal) cyclohexanone as a photo-crosslinking agent, and one weight percent each of 2,6-di-t-butyl-p-cresol and phenyl-α-naphthylamine as stabilizers. This photosensitive composition was applied on a silicon wafer, printed with a fine pattern, developed, and hardened by a heat treatment at 200° C. for 30 minutes.

The wafer printed with the fine pattern was immersed in a composition prepared by adding 2.0 g of a commercially available hydrogen peroxide solution (in a concentration of 38 percent) to a liquid mixture of 50 g of o-dichlorobenzene and 30 g of dedecylbenzenesulfonic acid and modified by heating at 60° C. for 30 minutes. The wafer in the bath was heated to 60° C., and 5 minutes later the resist was clearly dissolved away without a slightest trace of residue.

Reference Examples 1 to 6

On the basis of information obtained from the specifications of published patent applications, other stripping agents for the removal of photoresists were used to treat the same silicon wafers printed with the same fine pattern as in Example 1. The results are summarized in the following table.

| | Stripping agent | | Treatment | Resist | Literature |
|---|---|---|---|---|---|
| 1. | Dimethylsulfoxide | 30 ml | 100° C. 1 hr | No change | Japanese Patent Publication No. 12925/70 |
| | Methyl glycol | 70 ml | | | |
| 2. | Trichloroethylene | 60 ml | 60° C. 1 hr | No change | Japanese Patent Publication No. 5961/71 |
| | Ethylene glycol monoethyl ether | 20 ml | | | |
| | Ethylene glycol | 10 ml | | | |
| | Formic acid | 10 ml | | | |

-continued

| | Stripping agent | | Treatment | Resist | Literature |
|---|---|---|---|---|---|
| 3. | Water | 50 g | 150° C. 1 hr | No change | Japanese Patent Publication No. 43123/71 |
| | Sodium hydroxide | 50 g | | | |
| | Phenol | 50 g | | | |
| 4. | Rape oil | 60 g | 100° C. 1 hr | No change | Japanese Patent Publication No. 18922/71 |
| | Benzyl alcohol | 20 g | | | |
| | n-Amyl acetate | 4 g | | | |
| | "Plysurf A 208B"* | 1 g | | | |
| 5. | Dodecylbenzene-sulfonic acid | 35 g | 90° C. 30 min | No change | Japanese Patent Application Disclosure No. 72503/76 |
| | "Solvesso 150"** | 65 g | | | |
| 6. | "Stripping liquor 503 for OMR"*** | | 90° C. 30 min | No change | (Rubber stripping liquor sold by Tokyo Ohka Kogyo Company) |

*Trade designation of phosphoric ester of polyoxyethylene alkylaryl ether made by Dai-ichi Kogyo Seiyaku Company.
**Trade designation of an Esso Chemicals Company product comprising 98% aromatics, B.P. 150°-200° C.
***A product of Tokyo Ohka Kogyo Company consisting essentially of o-dichlorobenzene.

EXAMPLE 2

The same procedure as described in Example 1 was followed except that the stripping liquor composition used consisted of 40 g of stearlybenzenesulfonic acid, 30 g of o-dichlorobenzene, 30 g of tetrachloroethylene, and 2.0 g of a hydrogen peroxide solution (in a concentration of 38 percent. After a treatment at 60° C. for 5 minutes the resist was completely removed.

EXAMPLE 3

With the exception that a commercially available photoresist ("OMR-83" sold by Tokyo Ohka Kogyo Company) and that the heat treatment after development was carried out at 150° C. for 30 minutes, the same procedure as in Example 1 was followed. The resist was completely removed after the stripping treatment at 60° C. for 5 minutes.

Reference Example 7

The photoresist used in Example 1 and the commercially available photoresist used in Example 3 were treated with hot, concentrated sulfuric acid. The results were as tabulated below.

| Photoresist | Treatment | Mode of removal |
|---|---|---|
| of Example 1 | 150° C. 10 min | Removed in fine pattern |
| of Example 1 | 100° C. 30 min | Removed in fine pattern |
| of Example 3 | 100° C. 10 min | Dissolved away |

Reference Example 8

The procedure of Example 1 was repeated except that the stripping liquor composition was formed of 40 g of polyoxyethylene alkylphenyl ether as a nonion surface active agent, 30 g of o-dichlorobenzene, 30 g of tetrachloroethylene, and 1.5 g of hydrogen peroxide solution (in a concentration of 38 percent). The results are given in the following table.

| HLB* | Surface active agent** | Hydrogen peroxide solution | On heating (60° C.) | Treatment | Resist condition |
|---|---|---|---|---|---|
| 7.8 | "Emulgen 903" | Immiscible | Gas evolves | — | — |
| 10.9 | "Nonal 206" | Miscible | " | — | — |
| 13.3 | "Nonal 210" | " | " | — | — |
| 17.0 | "Noigen EA 170" | " | No gas evolution | 60° C. | No removal |

*Stands for Hydrophilic-Lypophilic Balance, which is a criterion of the hydrophilic and lypophilic properties of surface active agents. The agents with HLB values greater than 10-11 are hydrophilic, and those with less than the range are lypophilic.
**"Emulgen", "Nonal", and "Noigen" are trade designations of surface active agents sold, respectively, by Kao-Atlas Company, Toho Chemical Industry Company, and Dai-ichi Kogyo Seiyaku Company.

EXAMPLE 4

As the stripping liquor composition, a liquid mixture of 30 g of "Plysurf A-212E" (phosphoric ester of polyoxyethylene alkylaryl ether) of Dai-ichi Kogyo Seiyaku Company, 2.0 g of a hydrogen peroxide solution (in a concentration of 38 percent), and 50 g of o-dichlorobenzene was used. Otherwise the same procedure as in Example 3 was repeated for a stripping treatment at 60° C. for 5 minutes. The resist was completely removed. With a system free of hydrogen peroxide the resist could never be removed.

EXAMPLE 5

A vinyl cinnamate photoresist of commerce ("OSR" sold by Tokyo Ohka Kogyo Company) was used to form a pattern on aluminum, and the resist was hardened by a heat treatment at 150° for 30 minutes. Otherwise the procedure followed was the same as in Example 1. The resist was completely removed by the treatment at 60° C. for 10 minutes. The substrate of aluminum was not in the least impaired.

EXAMPLE 6

A photosensitive composition was prepared from cyclized cis-1,4-polybutadiene (degree of cyclization=65%, $[\eta]=0.45$), three weight percent of 2,6-bis(4'=azidobenzal) cyclohexanone as a photo-crosslinking agent, and one weight percent each of 2,6-di-t-butyl-p-cresol and phenyl-α-naphthylamine as stabilizers. This photosensitive composition was applied on a silicone wafer, printed with a fine pattern, developed, and hardened by a heat treatment at 200° C. for 30 minutes.

This wafer printed with the fine pattern was immersed in a bath formed of 50 g of o-dichlorobenzene and 30 g of dodecylbenzenesulfonic acid with the addition of 2.0 g each of ethylene glycol and a commercially available hydrogen peroxide solution (in a concentration of 38%), and heated at 60° C. Five minutes later the resist was completely dissolved away without any trace of residue left behind.

EXAMPLE 7

Except for the stripping liquor composition which consisted of 40 g of stearylbenzenesulfonic acid, 30 g of o-dichlorobenzene, 30 g of tetrachloroethylene, 2.0 g of glycerin, and 2.0 of a commercially available hydrogen peroxide solution, the same procedure as described in Example 1 was followed. After a stripping treatment at 100° C. for one minute, the resist was completely removed.

EXAMPLE 8

A commercially available photoresist ("OMR-83" of Tokyo Ohka Kogyo Company) was used and the heat treatment after development was carried out at 150° C. for 30 minutes. Otherwise the same procedure as in Example 1 was followed. After a stripping treatment at 60° C. for 5 minutes, the resist was completely removed.

EXAMPLE 9

The procedure of Example 3 was repeated with the exception that a commercially available photoresist ("Way-coat IC Resist Type 3", a product of Philip A. Hunt Chemical Corp.". The resist was completely removed by a stripping treatment at 100° C. for 15 seconds.

EXAMPLE 10

A mixed solution of 50 g of o-dichlorobenzene, 30 g of dodecylbenzenesulfonic acid, 2.0 g of ethylene glycol, and 2.0 g of hydrogen peroxide solution (in a concentration of 38%) was heated to 70° C. and 80° C., pieces of aluminum foil were immersed in baths at the different temperatures for 45 minutes, and the reductions in weight were determined to find the decreases in weight per unit area of the aluminum foil. The results were as follows:

at 70° C.—0.12 mg/cm$^2$
at 80° C.—0.31 mg/cm$^2$

Reference Example 9

The results attained in accordance with Example 10 but without the addition of ethylene glycol indicated high rates of corrosion, as follows:

at 70° C.—3.40 mg/cm$^2$
at 80° C.—7.10 mg/cm$^2$

EXAMPLE 11

In Example 10, the following polyhydric alcohols were used in place of ethylene glycol. The results were as given respectively.

| Polyhydric alcohol | Quantity of corrosion at 70° C. for 45 min. (mg/cm$^2$) |
| --- | --- |
| Propylene glycol | 0.15 |
| Glycerin | 0.11 |
| Dipropylene glycol | 0.20 |
| Diethanolamine | 0.13 |
| n-C$_{12}$H$_{25}$CON(C$_2$H$_4$OH)$_2$ | 0.12 |
| Sorbitan monolaurate | 0.19 |

The stripping capacities of the stripping liquor compositions containing such polyhydric alcohols were substantially the same as those of the compositions free of the polyhydric alcohols.

What is claimed is:

1. A stripping liquor composition for polybutadiene resists consisting essentially of
   (A) at least one compound selected from the group consisting of alkylaryl sulfonic acids,
   (B) hydrogen peroxide, and
   (C) at least one organic solvent.

2. A stripping liquor composition for polybutadiene resist consisting essentially of
   (A) at least one compound selected from the group consisting of alkylaryl sulfonic acids,
   (B) hydrogen peroxide,
   (C) at least one organic solvent, and
   (D) at least one polyhydric alcohol.

3. A composition according to claim 2, wherein the ratio of the component (A) to the component (C) ranges from 50:50 to 10:90, (by weight).

4. A composition according to claim 2, wherein the components (D) and (B) are used in amounts from 1 to 10 percent by weight each of the combined amount of the components (A) and (C).

5. The composition of claim 3 wherein the ratio is from 40:60 to 25:75.

UNITED STATES PATENT OFFICE
CERTIFICATE OF CORRECTION

Patent No. 4,169,068                    Dated Sept. 25, 1979

Inventor(s) Yoshiyuki Harita, et al

It is certified that error appears in the above-identified patent and that said Letters Patent are hereby corrected as shown below:

In the heading of the Patent [30] should read as follows:

[30]  Foreign Application Priority Data

August 20, 1976    JAPAN          51-99492
    November 24, 1976  JAPAN          51-140889

Signed and Sealed this

Seventeenth Day of June 1980

[SEAL]

Attest:

SIDNEY A. DIAMOND

Attesting Officer    Commissioner of Patents and Trademarks